(12) United States Patent
Nishijima et al.

(10) Patent No.: US 6,507,694 B2
(45) Date of Patent: Jan. 14, 2003

(54) INTERMITTENT DATA RECORDER, INTERMITTENT DATA RECORDING CONTROLLER, INTERMITTENT DATA RECORDING METHOD, AND INTERMITTENT DATA RECORDING CONTROL METHOD

(75) Inventors: Takeo Nishijima, Kanagawa (JP); Shigeru Akahane, Kanagawa (JP); Fumihiro Nagasawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/308,938
(22) PCT Filed: Sep. 28, 1998
(86) PCT No.: PCT/JP98/04334
§ 371 (c)(1),
(2), (4) Date: Jul. 27, 1999
(87) PCT Pub. No.: WO99/17289
PCT Pub. Date: Apr. 8, 1999

(65) Prior Publication Data
US 2002/0181931 A1 Dec. 5, 2002

(30) Foreign Application Priority Data
Sep. 29, 1997 (JP) ................................ 9-263381

(51) Int. Cl.⁷ .................................................. H04N 5/91
(52) U.S. Cl. ............................. 386/46; 386/124; 360/5
(58) Field of Search ........................ 386/46, 124, 117, 386/111, 110; 348/143, 715, 152, 153; 360/5

(56) References Cited

U.S. PATENT DOCUMENTS 5,920,673 A * 7/1999 Yasukohchi et al. .......... 386/46
5,999,690 A * 12/1999 Ro .............................. 386/46
6,167,186 A * 12/2000 Kawasaki et al. ............ 386/46

FOREIGN PATENT DOCUMENTS

JP 08161828 6/1996

* cited by examiner

Primary Examiner—Vincent Boccio
(74) Attorney, Agent, or Firm—Frommer Lawrence & Haug LLP; William S. Frommer; Dennis M. Smid

(57) ABSTRACT

It is an object of the invention to suppress burden on a device portion and a tape recording medium occurred through recording of intermittent data. A CPU (7) controls a RAM block (3) and a VTR block (4) to record input information on a RAM (32), and transfer intermittent data included in a predetermined amount of input information recorded on the RAM (32) to a video tape (44) to be recorded while continuing recording of input information on the RAM (32) when the input information recorded on the RAM (32) reaches the predetermined amount. As described above, the recording operation of intermittent data in the VTR block (4) is suppressed to minimum and burden on the device portion and the video tape (44) in the VTR block (4) occurred through recording of intermittent data can be suppressed while performing excellent intermittent recording.

16 Claims, 10 Drawing Sheets

FIG.2A  input picture data
FIG.2B  RAM
FIG.2C  video tape

INTERMITTENT DATA RECORDER, INTERMITTENT DATA RECORDING CONTROLLER, INTERMITTENT DATA RECORDING METHOD, AND INTERMITTENT DATA RECORDING CONTROL METHOD

TECHNICAL FIELD

The invention relates to an intermittent data recording device used for intermittent recording of input information such as video signals and so on, an intermittent data recording control device, a method of recording intermittent data and a method of controlling recording intermittent data in a surveillance video recording device and so on.

BACKGROUND OF ART

In these years, a surveillance video recording device is used for a security reason in places where, for example, automatic teller machines (ATM) are placed. Such a surveillance video recording device is called a time-laps VTR as well and usually made to record video signals outputted form a surveillance video camera on a video tape intermittently by a VTR (video tape recorder). Further, in such a surveillance video recording device, a recording head is required to be rotated constantly so as to perform steady recording of intermittent data.

By the way, a surveillance video recording device of the related art as described above performs recording by shifting the video tape by a predetermined amount in every one field picture being recorded while constantly rotating a recording head to perform recording of intermittent data. As a result, operation of the device portion for shifting the video tape is frequently repeated while the head is rotating with constantly being in a contact with the video tape.

As described, there is a problem that burden on the device portion and the tape itself becomes heavy since operation for tape running is frequently repeated. Further, there is another problem that an abrasion of the head and burden on the tape itself becomes heavy since the head is rotating with constantly being in a contact with the video tape. For example, a total rotating time of the head reaches 8760 (365 days×24 h) hours per year provided that the device is continuously used every day for one year (365 days). Accordingly, head exchange is required once a year on an average. Further, there is a problem that dropping of magnetic powder of the video tape occurs so that clog of the head tends to occur since the head is rotating with constantly being in a contact with the video tape.

Further, in the surveillance device of these days, there is such a case that a disk recording medium is used as a main recording medium instead of the video tape and data recorded on the disk recording medium is further to be backed up on the data recording medium which is used in DAT (digital audio tape recorder) and so on. However, in such a surveillance device, there is a problem that recording on the disk recording medium has to be interrupted during the back-up, so that surveillance can not be continued during the time.

DISCLOSURE OF INVENTION

The invention is designed to overcome the forgoing problems. It is an object to provide an intermittent data recording device, an intermittent data recording control device, a method of recording intermittent data and a method of controlling recording of intermittent data, which can lighten the burden to the device portion and the tape recording medium occurred through recording intermittent data.

The first intermittent data recording device of the invention comprises: first recording means for recording input information including intermittent data which is to be recorded on the tape recording medium on a predetermined recording medium; second recording means for recording intermittent data included in input information on a tape recording medium; and control means for controlling the first recording means and the second recording means to record input information on the first recording medium, and to transfer intermittent data included in a predetermined amount of input information recorded on the predetermined recording medium to be recorded on the tape recording medium, while making recording of input information continued when input information recorded on the predetermined recording medium reaches the predetermined amount.

The second intermittent data recording device of the invention comprises: first recording means for recording input information including intermittent data which is to be recorded on the tape recording medium on a first recording medium; second recording means for recording intermittent data included in the input information recorded on the first recording medium on a second recording medium; third recording means for recording intermittent data recorded on the second recording medium on the tape recording medium; and control means for controlling the first recording means, the second recording means and the third recording means to record input information on the first recording medium, and to transfer intermittent data included in a first predetermined amount of input information recorded on the first recording medium to be recorded on the second recording medium, while continuing recording of input information when input information recorded on the first recording medium reaches the first predetermined amount, and to transfer the second predetermined amount of intermittent data recorded on the second recording medium to be recorded on the tape recording medium when the intermittent data recorded on the second recording medium reaches the second predetermined amount.

The first intermittent data recording control device of the invention comprises: input information recording means for recording input information including intermittent data which is to be recorded on the tape recording medium on a predetermined recording medium; and control means for controlling the input information recording means and the tape recording device to record input information on the predetermined recording medium, and to transfer intermittent data included in the predetermined amount of input information recorded on the predetermined recording medium to be recorded on the tape recording medium, while continuing recording of the input information when the input information recorded on the predetermined recording medium reaches a predetermined amount.

The second intermittent data recording control device of the invention comprises: first recording means for recording input information including intermittent data which is to be recorded on the tape recording medium on a first recording medium; second recording means for recording intermittent data included in input information recorded on the first recording medium on a second recording medium; and control means for controlling the first recording means, the second recording means and the tape recording device to record input information on the first recording medium, and to transfer intermittent data included in a first predetermined amount of input information recorded on the first recording medium to be recorded on the second recording medium, while continuing recording of the input information when input information recorded on the first recording medium reaches the first predetermined amount, and to transfer the second predetermined amount of intermittent data recorded on the second recording medium to be recorded on the tape recording medium when intermittent data recorded on the second recording medium reaches the second predetermined amount.

The first method of recording intermittent data of the invention is to record input information including intermittent data which is to be recorded on the predetermined tape recording medium on a predetermined recording medium; and to transfer intermittent data included in a predetermined amount of input information recorded on the predetermined recording medium from the predetermined recording medium to the tape recording medium to record it, while continuing recording of the input information when input information recorded on the predetermined recording medium reaches a predetermined amount.

The second method of recording intermittent data of the invention is to record input information including intermittent data which is to be recorded on the predetermined tape recording medium on a first recording medium; to transfer intermittent data included in a first predetermined amount of input information recorded on the first recording medium from the first recording medium to a second recording medium to record it, while continuing recording of input information when input information recorded on the first recording medium reaches the first predetermined amount; and to transfer the second predetermined amount of intermittent recorded on the second recording medium from the second recording medium to a tape recording medium to record it, when intermittent data recorded on the second recording medium reaches the second predetermined amount.

The first method of controlling recording of intermittent data is to record input information including intermittent data which is to be recorded on the predetermined tape recording medium on a predetermined recording medium; and to transfer intermittent data included in a predetermined amount of input information recorded on the predetermined recording medium from the predetermined recording medium to the tape recording medium to record it, while continuing recording of the input information when input information recorded on the predetermined recording medium reaches a predetermined amount.

The second method of controlling recording of intermittent data is to record input information including intermittent data which is to be recorded on the predetermined tape recording medium on a first recording medium; to transfer intermittent data included in a first predetermined amount of input information recorded on the first recording medium from the first recording medium to a second recording medium to record it, while continuing recording of the input information when input information recorded on the first recording medium reaches the first predetermined amount; and to transfer intermittent data included in a second predetermined amount of input information recorded on the second recording medium from the second recording medium to a tape recording medium to record it, when input information recorded on the second recording medium reaches the second predetermined amount.

In the first intermittent data recording device or the first method of recording intermittent data of the invention, input information is recorded on a predetermined recording medium; and intermittent data included in a predetermined amount of input information recorded on the predetermined recording medium is transferred from the predetermined recording medium to the tape recording medium to be recorded, while recording of the input information is continued when input information recorded on the predetermined recording medium reaches a predetermined amount.

In the second intermittent data recording device or the second method of recording intermittent data of the invention, input information is recorded on a first recording medium; intermittent data included in a first predetermined amount of input information recorded on the first recording medium is transferred from the first recording medium to a second recording medium to be recorded, while recording of the input information is continued when input information recorded on the first recording medium reaches the first predetermined amount; and intermittent data included in a second predetermined amount of input information recorded on the second recording medium is transferred from the second recording medium to a tape recording medium to be recorded, when the input information recorded on the second recording medium reaches the second predetermined amount.

In the first intermittent data recording device or the first method of recording intermittent data of the invention, input information is recorded on a predetermined recording medium; and intermittent data included in a predetermined amount of input information recorded on the predetermined recording medium is transferred from the predetermined recording medium to the tape recording medium to be recorded, while recording of input information is continued when input information recorded on the predetermined recording medium reaches a predetermined amount.

In the second intermittent data recording device or the second method of recording intermittent data of the invention, input information is recorded on a first recording medium; intermittent data included in a first predetermined amount of input information recorded on the first recording medium is transferred from the first recording medium to a second recording medium to be recorded, while recording of input information is continued when input information recorded on the first recording medium reaches the first predetermined amount; and a second predetermined amount of intermittent data recorded on the second recording medium is transferred from the second recording medium to a tape recording medium to be recorded, when the intermittent data recorded on the second recording medium reaches the second predetermined amount.

Other objects, characters and advantages of the invention will be made evident in the following description.

BEST MODE FOR CARRYING OUT THE INVENTION

Embodiments of the invention will be described in detail with reference to the drawings in the followings.

FIRST EMBODIMENT

Figure 1:
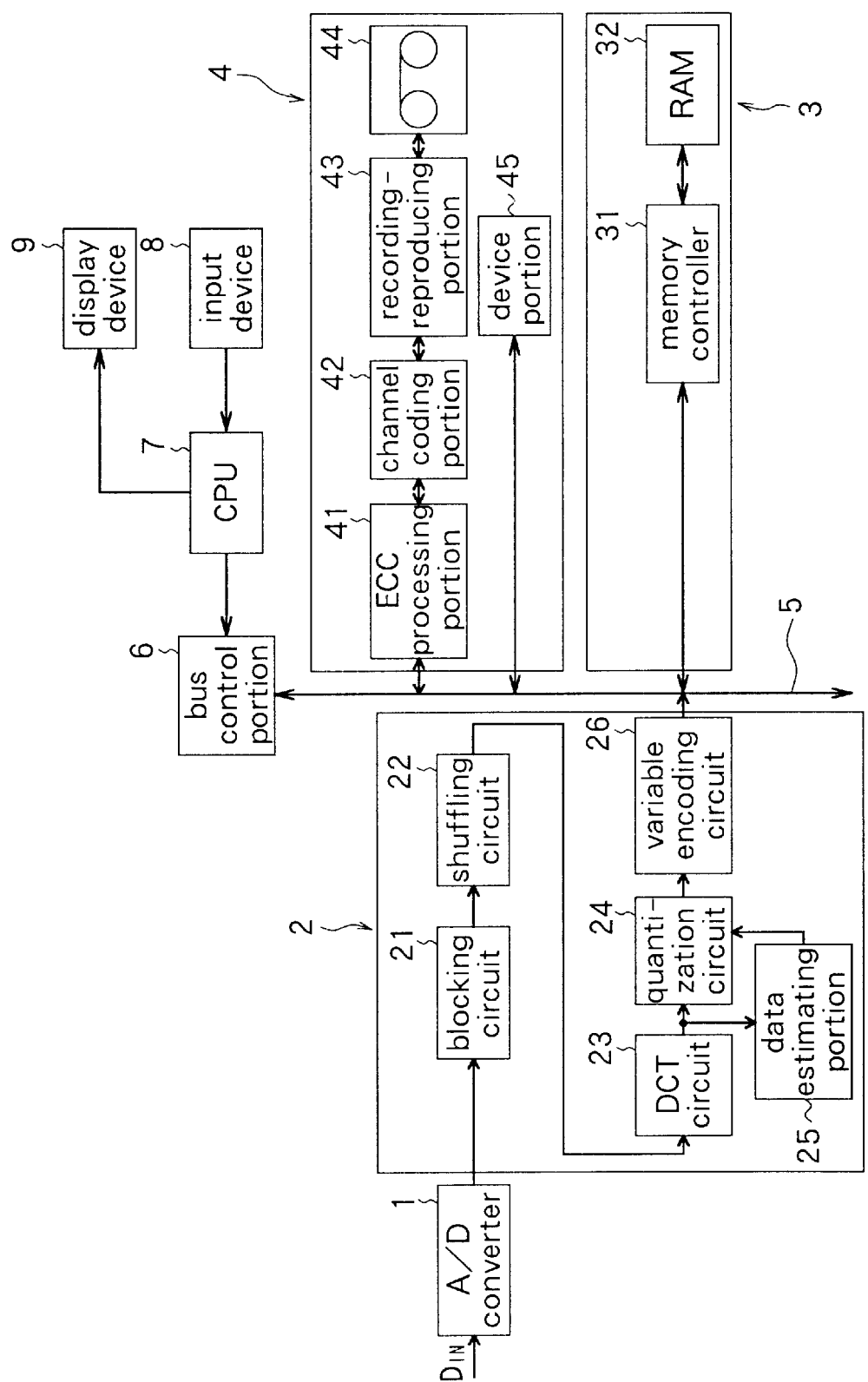
FIG. 1 is a block diagram showing a configuration of an intermittent data recording device according to a first embodiment of the invention.

First, a first embodiment of the invention will be described. FIG. 1 is a block diagram showing a configuration of an intermittent data recording device according to the first embodiment of the invention. The intermittent data recording device according the embodiment is used as, for example, a surveillance video recording device, and input information includes at least picture data from a surveillance video camera and so on. In addition, it includes audio data or additional data (for example, the transaction number, the card number, date, time and so on in an automatic teller machine (ATM)). However, it is described by referring only to picture data among input information in the followings so as to simplify the description. Further, in the intermittent data recording device according to the embodiment, data which is recorded in the end is input information being made to be intermittent data. Data being made to be intermittent data means intermittent data which is intermittent in terms of time. Further, the description in the followings includes the description of the configuration of the intermittent data recording control device according to the embodiment.

The intermittent data recording device according to the embodiment comprises an A/D converter 1 which performs analog-digital conversion of analog input picture data $D_{IN}$ from a video camera and so on, an compression processing portion 2 which compresses output data from the A/D converter 1, a RAM (random access memory) block 3 for temporarily recording picture data compressed by the compression processing portion 2, a VTR block 4 for recording intermittent data included in the picture data compressed by the compression processing portion 2, which is to be recorded in the end, an inside bus 5 including a data bus and a control bus which mutually connect the compression processing portion 2, the RAM block 3 and the VTR block 4, and a bus control portion 6 which controls the inside bus 5. Further, the RAM block 3 corresponds to the first recording means of the first intermittent data recording device and the input information recording means of the first intermittent data recording control device of the invention. Further, the compression processing portion 2 corresponds to the compressing means of the first intermittent data recording device of the invention. Moreover, the VTR block 4 corresponds to the second recording means of the first intermittent data recording device of the invention.

The intermittent data recording device is, further, connected to the bus control portion 6 and comprises a CPU (central processing unit) 7 which controls the whole portion of the intermittent data recording device, an input device 8 such as a key board and so on which is connected to the CPU 7 and a display device 9 such as CRT (cathode-ray tube) which is connected to the CPU 7. Further, the CPU 7 corresponds to the control means of the intermittent data recording device and the first intermittent data recording control device of the invention.

Further, in the followings, the input picture data $D_{IN}$ and corresponding various state of data before being recorded are collectively called input information as well.

The compression processing portion 2 comprises a blocking circuit 21 which divides the inputted picture data to a predetermined data block, a shuffling circuit 22 replacing the data block divided by the blocking circuit 21 to the order of the predetermined shuffling pattern, a DCT circuit 23 which performs DCT (discrete cosine transformation) processing on output data from the shuffling circuit 22, a quantization circuit 24 which quantizes output data from the DCT circuit 23 by the quantum characteristic based on the quantization table, a data estimating portion 25 which changes the quantization table of the quantization circuit 24 by estimating the amount of data from coefficient of the DCT after the DCT processing in the DCT circuit 23, and a variable encryption circuit 26 which outputs output data to the inside bus 5 by variable-encrypting output data of the quantization circuit 24. Further, the compression processing portion 2 may have a configuration without, for example, the data estimating portion 25. Further, the configuration of the compression processing portion 2 is not limited to the method shown in figure but other method may be used.

The RAM block 3 comprises a RAM 32 as a predetermined recording medium which records input information including intermittent data and a memory controller 31 which performs control of the operation of writing data from the inside bus 5 to the RAM 32, and of the operation of reading out data recorded on the RAM 32 and outputting it to the inside bus 5, while being connected to the RAM 32 and the inside bus 5. The RAM block 3 (memory controller 31), under the control of the CPU 7, records input information on the RAM 32 according to the order of input operation while reading out information recorded on the RAM 32 and transferring it to the VTR block 4 through the inside bus 5 when input information recorded on the RAM 32 reaches the predetermined amount. Further, in the RAM block 3, rate of reading data is made sufficiently faster than that of writing data to the RAM 32 so that transferring data from the RAM block 3 to the VTR 4 can be started when input information recorded on the RAM 32 reaches the recording capacitance of the RAM 32. Accordingly, the predetermined amount may be, basically, same as the recording capacitance of the RAM 32. However, in practice, it is preferable to have some space between the operation of recording and reproducing data in the RAM block 3. Accordingly, it is preferable to set the predetermined amount smaller than the recording capacitance of the RAM 32.

The RAM 32 is, at least on the appearance, made to be able to perform the operation of recording and reproducing simultaneously. For example, the simultaneous recording and reproducing can be performed perfectly by using a dual-port RAM having two ports for inputting/outputting data. Further, in a case where a regular RAM having only one port for inputting/outputting is used in the RAM 32, the operation of recording and reproducing can be simultaneously performed at least on the appearance by, for example, performing the operation of recording and reproducing by time-division using a time slot.

The VTR block 4 is the portion which records intermittent data transferred form the RAM 32 on a video tape 44 as the tape recording medium while reproducing intermittent data from the video tape 44. The VTR block 4 comprises an ECC (error correcting code) processing portion 41 connected to the inside bus 5, a channel coding portion 42 connected to the ECC processing portion 41, a recording-reproducing portion 43 connected to the channel coding portion 42 and a device portion including running portion of the video tape 44 and the drive portion of the rotating drum. The recording-reproducing portion 43 includes a recording head, reproducing head and an erasing head.

The VTR block 4 is made to add the ECC to intermittent data from the inside bus 5 by the ECC processing portion 41, to apply channel coding by the channel coding portion 42 for converting it to a proper form for recording and to record it on the video tape 44 by a recording head of the recording-reproducing portion 43 during the recording operation.

Further, the VTR block 4 is made to reproduce data from the video tape 44 by the reproducing head of the recording-reproducing portion 43, to apply channel coding to the data by the channel coding portion 42, to perform error detection and error correction by the ECC processing portion 41 and to output it to the inside bus 5 during the reproducing operation.

The CPU 7 is made to control the RAM block 3 as the first recording medium and the input information recording medium, and the VTR block 4 as the second recording medium to record input information on the RAM 32 as the predetermined recording medium. Further, it is made to transfer intermittent data included in the predetermined amount of input information recorded on the RAM 32 to be recorded on the video tape 44 as the tape recording medium while continuing recording of input information on the RAM 32 when input information recorded on the RAM 32 reaches the predetermined amount.

Figure 2:
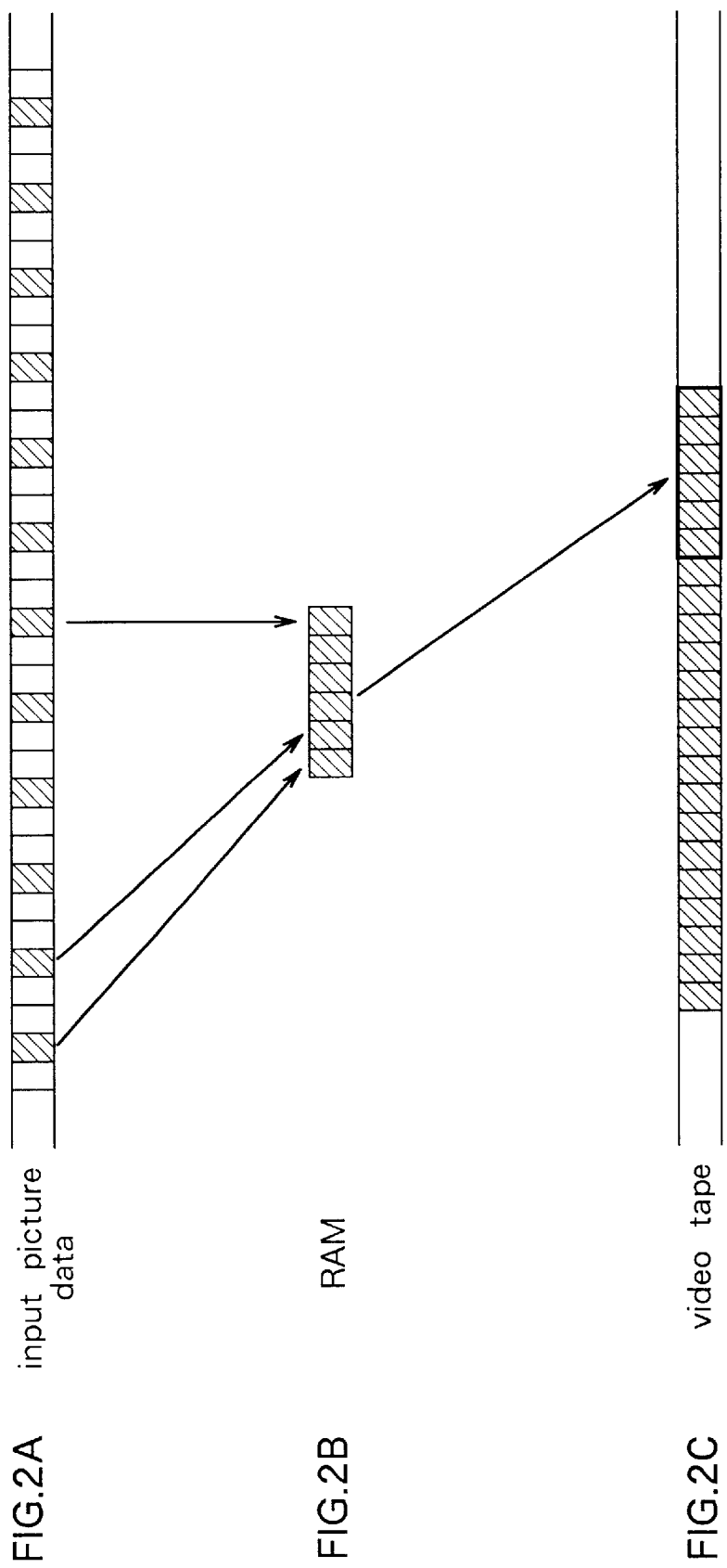
FIG. 2A, FIG. 2B and FIG. 2C are explanatory drawings showing the flow of data until input information is recorded on a video tape as intermittent data and the data structure in the intermittent data recording device according to the first embodiment of the invention.

Here, with reference to FIG. 2A to FIG. 2C, in the embodiment, flow of the input picture data $D_{IN}$ inputted in the device until it is recorded on the video tape 44 as intermittent data will be described along with its data structure. FIG. 2A shows the data structure of a video frame of the input picture data $D_{IN}$ in real time. Further, FIG. 2B shows the data structure of the RAM 32 while FIG. 2C shows the data structure of the video tape 44. Further, one measurement of the block elements represents one frame in FIG. 2A to FIG. 2C.

In the embodiment, the input picture data $D_{IN}$ as input information inputted in the device is continuous data in terms of time (FIG. 2A). The continuous input picture data $D_{IN}$ in terms of time, is, for example, made to be intermittent data before being recorded on the RAM 32 or while being recorded (FIG. 2B). For example, when it is made to be intermittent data while being recorded, the procedure is performed by the CPU 7 controlling the RAM block 3 to record picture data inputted in the RAM block 3 on the RAM 32 intermittently. In the examples shown in FIG. 2A to FIG. 2C, one frame of data among three frames of the input picture data $D_{IN}$ is intermittently recorded on the RAM 32. Further, when it is made to be intermittent data before recording, the CPU 7 controls the control portion 6 to make picture data intermittent to be inputted in the RAM 32.

In the embodiment, when picture data being made to be intermittent data as described is recorded on the RAM 32 to the predetermined amount (six frames of data in examples of FIG. 2A to FIG. 2C), the predetermined amount of intermittent data recorded on the RAM 32 is transferred to the VTR block 40 and recorded on the video tape 44 (FIG. 2C). Further, recording picture data on the RAM 32 is continued while transferring intermittent data. Accordingly, in the embodiment, the RAM block 3 operates continuously so that picture data being made to be intermittent data is continuously recorded in terms of time. On the other hand, the RAM block 3 operates intermittently so that the predetermined amount of intermittent data is intermittently recorded in terms of time.

Further, data which is not yet being made to be intermittent data may be recorded on the RAM 32 first, and it may be made to be intermittent data when transferring data from the RAM 32 to the video tape 44. In such a case, for example, the CPU 7 controls the RAM block 3 to reproduce picture data from intermittent address.

Next, operation of the intermittent data recording device according to the embodiment will be described. Further, the following description includes the description of method of recording the intermittent data and the method of controlling recording the intermittent data according to the embodiment.

First, the main operation of the intermittent data recording device of the embodiment will be described according to the flow chart of FIG. 3 while referring to the block diagram shown in FIG. 1.

In the intermittent data recording device according to the embodiment, when starting the operation is indicated and input picture data $D_{IN}$ is recorded as input information from outside of the device, the CPU 7 controls the RAM block 3 through the bus control portion 6 to start recording input information from outside the device on the RAM 32 (step S101). In the recording operation of the RAM block 3 at this time, input picture data $D_{IN}$ is A/D converted by an A/D converter 1, compressed by a compressing process portion 2, transferred to the RAM block 3 through the inside bus 5 and recorded on the RAM 32 by the RAM block 3. Further, data recorded on the RAM 32 at this time may be continuous data which has not been made intermittent (intermittent data which is to be recorded on the video tape 44 in the end) or data which has been made to be intermittent data at the time of recording or, before recording it on the RAM 32.

Next, the CPU 7 judges whether the data recorded on the RAM 32 has reached the predetermined amount or not (step S102). Here, the judging operation is repeated when the recorded data has not reached the predetermined amount (step S102: N).

On the other hand, when the recorded data has reached the predetermined amount (step S102: Y), the CPU 7 controls the RAM block 3 to start reproducing operation of the predetermined amount of data recorded on the RAM block 3 (step S103) and transferring operation of reproduced data to the VTR block 4 (step S104) while continuing data recording on the RAM 32. At this time, transferring data from the RAM block 3 to the VTR block 4 is performed through the inside bus 5. Further, in such a case where the data recorded on the RAM 32 in the step S101 is continuous data, which has not been made to be intermittent data, the CPU 7 controls the RAM block 3 to make data reproduced from the RAM 32 to be intermittent data. Further, when data recorded on the RAM 32 in the step S101 is data which is already made to be intermittent, the intermittent process of data is not required.

When transferring data from the RAM block 3 to the VTR block 4 in the step 104 is started, the CPU 7 controls the VTR block 4 through the bus control portion 6 to start recording operation of the intermittent data transferred from the RAM block 3 on the video tape 44 (step S105).

Next, the CPU 7 judges whether reproduction of the predetermined amount of data recorded in the RAM block 3 is perfectly completed or not (step S106). If it is not completed (N), the judging operation is repeated. If it is completed (step s106: Y), the CPU 7 controls the RAM block 3 to stop the reproducing operation of data recorded on the RAM 32 (step S107) and transferring operation of intermittent data to the VTR block 4 (step S108). Finally, the CPU 7 controls the VTR block 4 to stop the recording operation of intermittent data transferred from the RAM block 3 on the video tape 44 (step S109), and the process goes back to the step S101.

Figure 3:
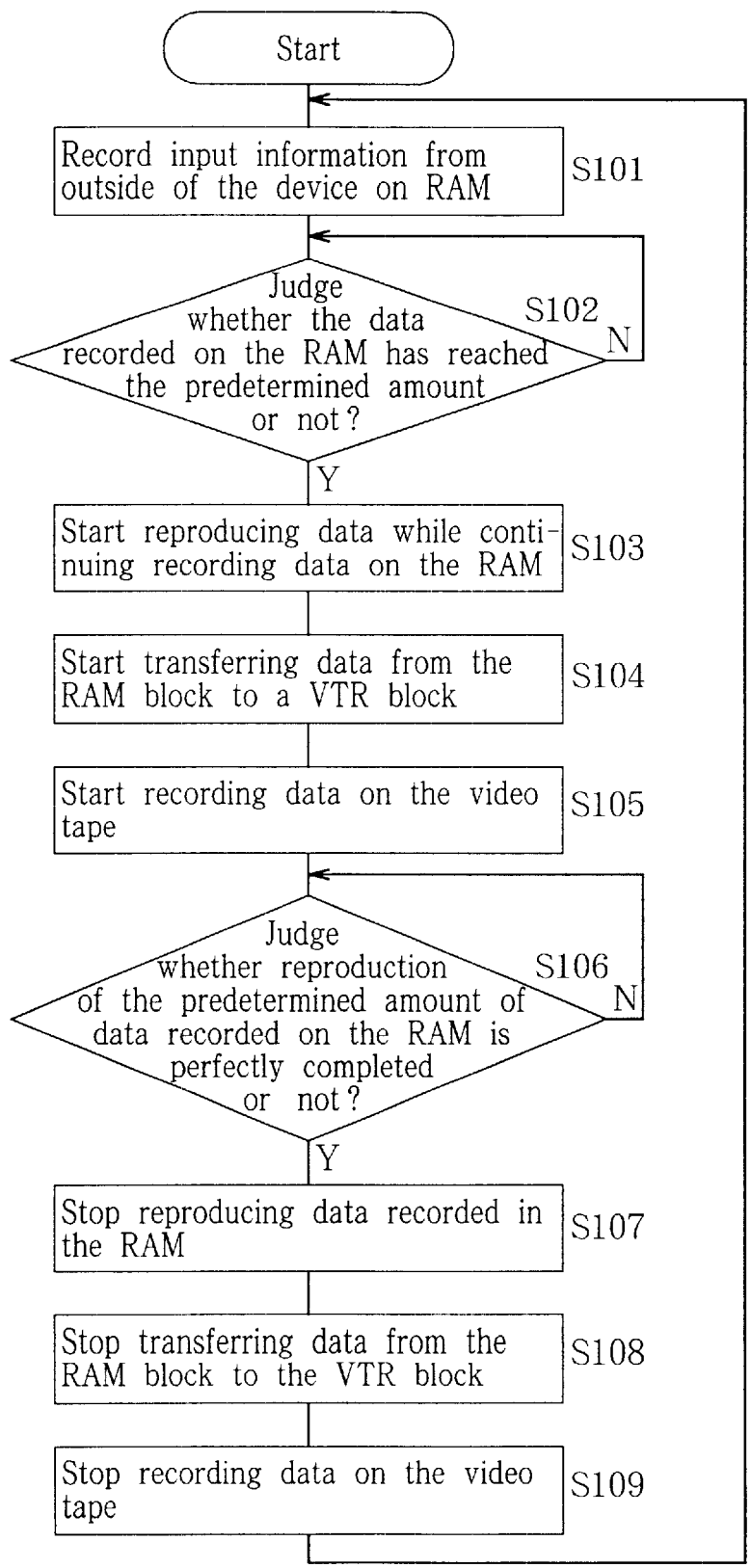
FIG. 3 is a flow chart showing a main operation of the intermittent data recording device according to the first embodiment of the invention.
Figures 4A, 4B:
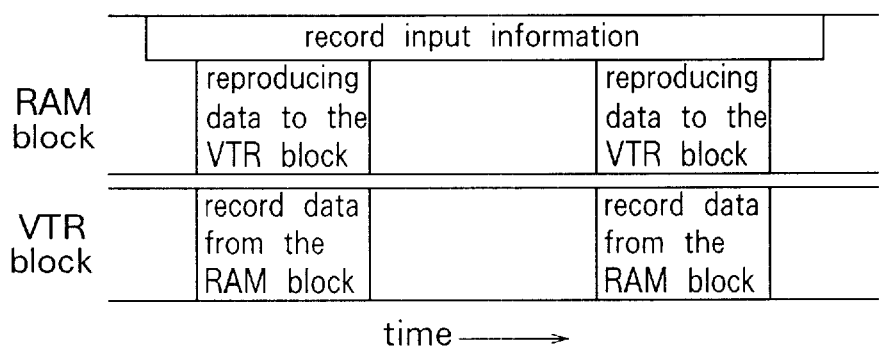
FIG. 4A and FIG. 4B are explanatory drawings showing timing of the operation of the intermittent data recording device according to the first embodiment of the invention.

FIG. 4A and FIG. 4B show the operation timing of the VTR block 4 and the RAM block 3 in a case where the recording operation of intermittent data is performed according to the operation shown in FIG. 3. In such a case, in the RAM block 3, as shown in FIG. 4A, when recorded data reaches the predetermined amount, the reproducing operation of the RAM 32 is started so that the recorded information is outputted to the VTR block 4 without stopping recording operation of input information while the recording operation of input information on the RAM 32 is continuously performed. Further, when the predetermined amount of data recorded on the RAM 32 is completely reproduced, the reproduction operation of the RAM 32 finishes. On the other hand, in the VTR block 4, as shown in FIG. 4B, the recording operation of intermittent data outputted from the RAM block 3 is started at the same time of starting the reproducing operation in the RAM block 3, and the recording operation finishes when the reproducing operation finishes.

As described above, according to the intermittent data recording device of the embodiment, the recording operation of intermittent data in the VTR block 4 can be suppressed to minimum since the CPU 7 is made to control the RAM block 3 and the VTR block 4 to record input information on the RAM 32, and to transfer intermittent data included in the predetermined amount of the input information recorded on the RAM 32 to the video tape 44 as a tape recording medium to be recorded when the input information recorded on the RAM 32 reaches the predetermined amount, while continuing recording of the input information on the RAM 32. For example, the recording head for performing the intermittent recording is not required to be rotated constantly, unlike the related art, so that the number of repeating of the device operation for running the video tape 44 can be decreased as well. As a result, burden on the device portion and the video tape 44 resulted from repeating the operation of running the tape can be lightened.

Further, according to the embodiment, the recording head does not rotate with constantly being in a contact with the video tape 44 in the VTR block 4 like the related art, so that the unnecessary using time of the head can be decreased by limiting rotation of the head only when actually recording intermittent data. As a result, wear of the head and burden on the tape itself can be suppressed so that the life of the head can be prolonged before it needs to be exchanged. For example, when intermittent recording of one field of picture data per second is performed, real time becomes one hour provided that time of performing picture recording by actually rotating the head is one minute. As a result, using time of the head becomes technically one sixtieth compared to the device of the related art.

Further, a probability of the head being clogged can be decreased since dropping of the magnetic powder of the video tape 44, which is resulted from the fact that the head is rotating by constantly having a contact with the video tape 44, is suppressed. Further, in the embodiment, the recording operation of data in the RAM block 3 is constantly performed so that the required intermittent data can be completely transferred and recorded on the VTR block 4. As a result, the problem that recording operation on the disk recording medium has to be interrupted during back-up operation which occurred in such a device using a disk recording medium as a main recording medium instead of using the video tape like the related art, does not occur. As described, according to the embodiment, burden to the device portion and the video tape 44 in the VTR block 4 occurred through recording intermittent data can be decreased while performing the excellent intermittent recording.

Next, a second embodiment of the invention will be described. In the first embodiment described above, the input picture data $D_{IN}$ with a continuous data structure in terms of time is inputted in the device as input information, and the inputted input picture data $D_{IN}$ is made to be intermittent and recorded in the device. However, in the embodiment, the input picture data $D_{IN}$ inputted to the device is intermittent data in terms of time.

Figure 5:
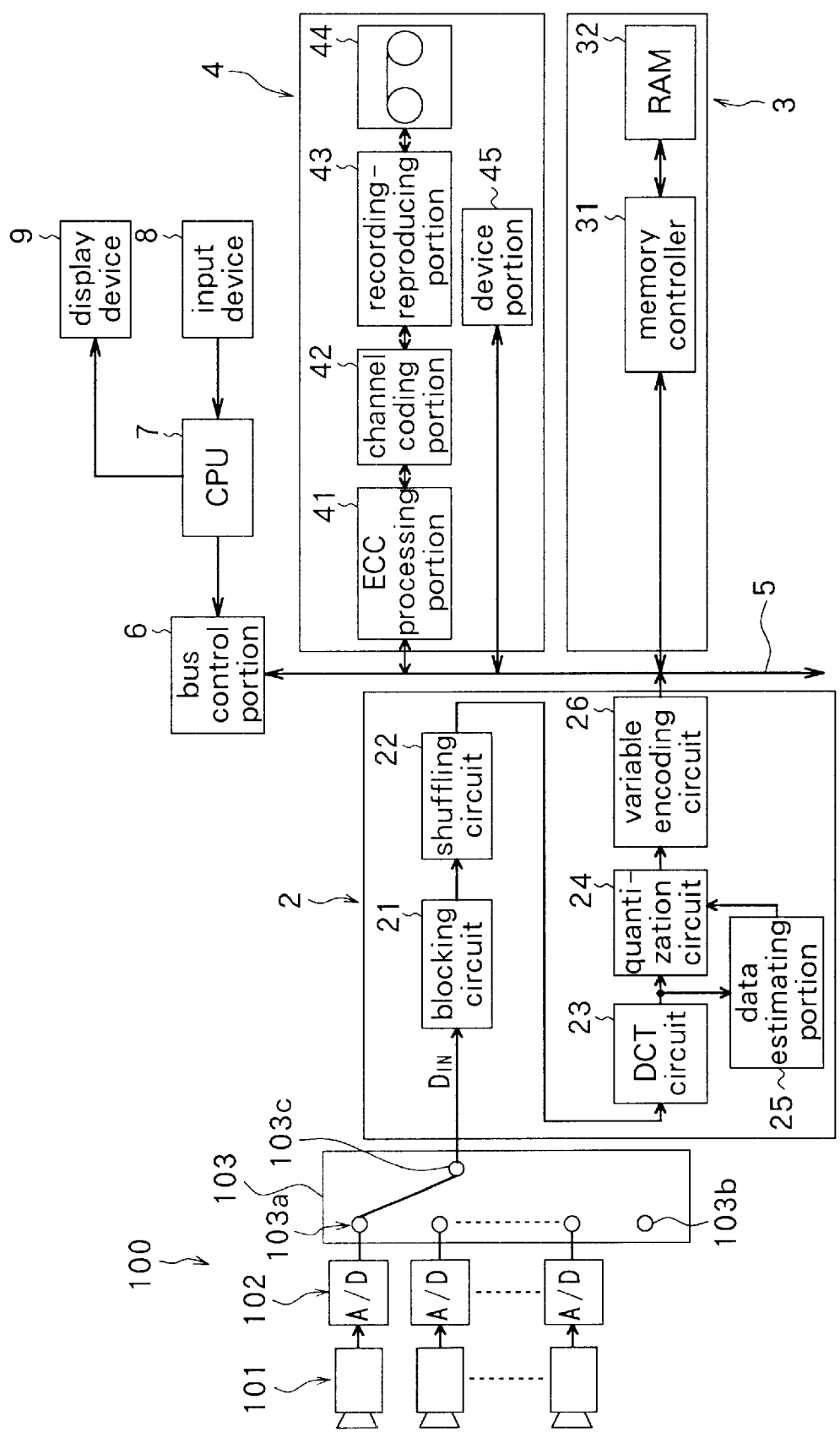
FIG. 5 is a block diagram showing a configuration of an intermittent recording device according to a second embodiment of the invention.

FIG. 5 is a block diagram showing the configuration of the intermittent data recording device according to the embodiment of the invention. Further, like numerals are adopted to the configurations identical to those of the intermittent data recording device according to the first embodiment and the description will be omitted.

In the intermittent data recording device according to the embodiment, the intermittent input picture data $D_{IN}$ from an outside input device 100 is made to be inputted to a blocking circuit 21 of the compression processing portion 2 as input information. The outside input device 100 comprises a plurality of video cameras 101 for filming the areas which is to be under surveillance, a plurality of A/D converters 102 for A/D converting a plurality of image signals outputted from a plurality of the video cameras 101, and a multiplexer 103 which selectively picks up output data from the A/D converter in a predetermined order and outputs intermittent input picture data $D_{IN}$.

The multiprexer 103 comprises a plurality of input terminals 103a to which output signals of each A/D converter corresponding to a plurality of the video cameras 101 are inputted, an input terminal 103b to which no output signals from the video cameras 101 are outputted, and output terminals 103c which are selectively connected to the input terminals 103a and the input terminal 103b. In the multiplexer 103, the input terminal connected to the output terminal 103c is switched in a predetermined timing so that the intermittent input picture data $D_{IN}$ including the output signals of the A/D converter 102 is made to be outputted from the output terminal 103c.

In the intermittent data recording device according to the embodiment, the intermittent input picture data $D_{IN}$ is, like the intermittent data recording device according to the first embodiment, compressed in the compression processing portion 2 before being transferred to the RAM block 3 through the inside bus 5 and recorded on the RAM 32 by the RAM block 3. Further, the operation after the recording data in the RAM block 3 is identical to that of the first embodiment as described above.

Further, other configurations, operations and effects of the embodiment is identical to those of the first embodiment.

THIRD EMBODIMENT

First, a third embodiment of the invention will be described. In the first embodiment described above, input picture data $D_{IN}$ is temporarily recorded in the RAM block 3 before being transferred directly from the RAM block 3 to the VTR block 4. However, in the embodiment, another data recording block is provided in the data transferring process between the RAM block 3 and the VTR block 4 in order to enable better recording of intermittent data.

Figure 6:
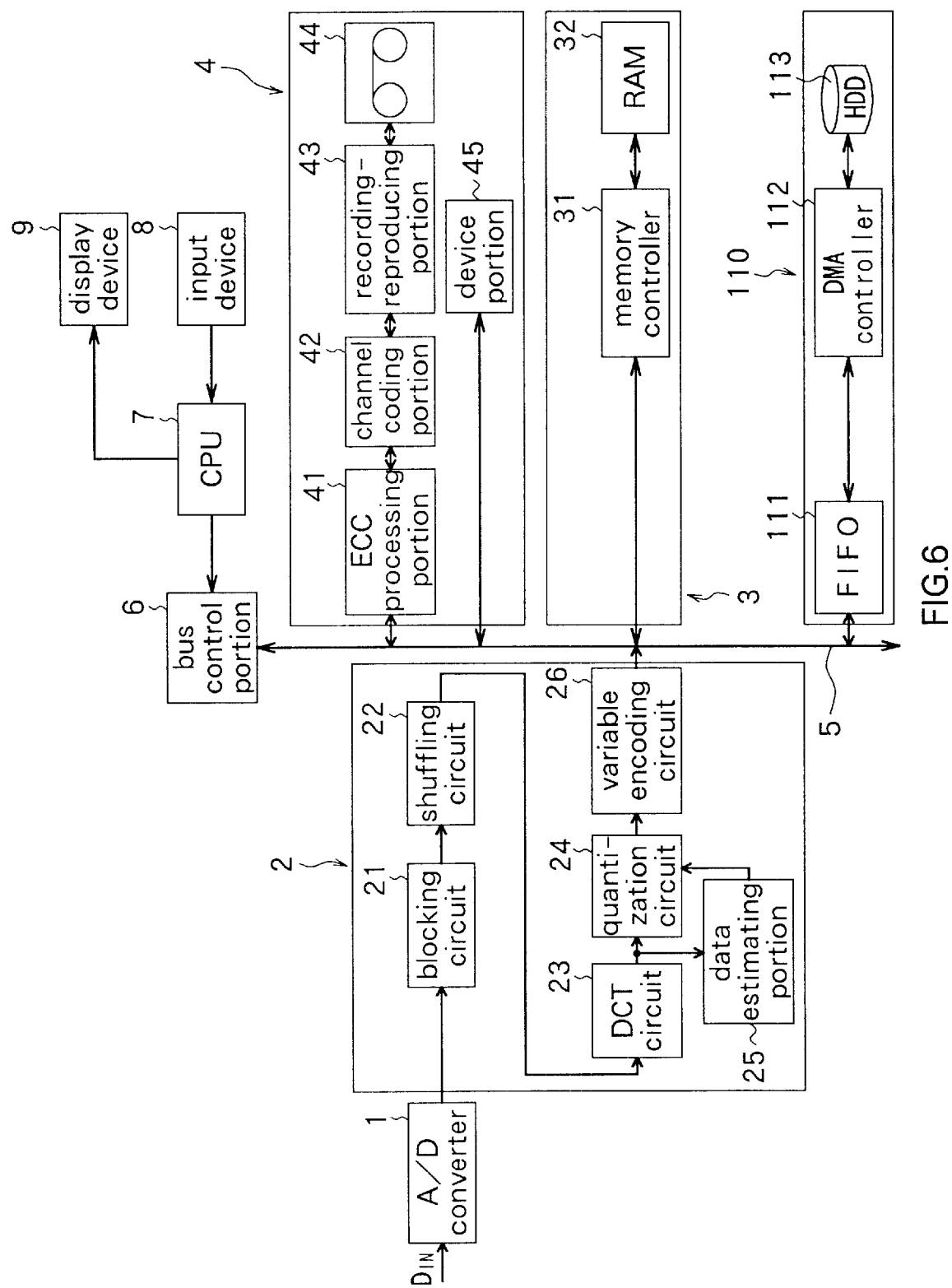
FIG. 6 is a block diagram of a configuration of an intermittent data recording device according to a third embodiment of the invention.

FIG. 6 is a block diagram showing a configuration of the intermittent data recording device according to the third embodiment of the invention. Further, like numerals are adopted to the configurations identical to those of the intermittent data recording device of the first embodiment, and the description will be omitted. The intermittent data recording device according to the embodiment comprises a hard disk drive (called HDD in the followings) block 110 for temporarily recording intermittent data included in input information recorded on the RAM 32 in addition to the composing element shown in FIG. 1. Further, the RAM block 3 of the embodiment corresponds to the first recording means of the second intermittent data recording device, the second intermittent data recording control device, the second method of recording intermittent data and the second method of controlling recording of intermittent data of the invention. Further, the RAM 32 of the embodiment corresponds to the first recording medium of the second intermittent data recording device, the second intermittent data recording control device, the second intermittent data recording method and the second data recording control method of the invention. Further, the VTR block 4 of the embodiment corresponds to the third recording means in the second intermittent data recording device of the invention.

The HDD block 110 is formed including a hard disk. It comprises an HDD 113 which temporarily records intermittent data included in input information recorded on the RAM 32, a direct memory access (called DMA in the followings) controller 112 connected to the HDD 113, which performs control of recording information on the HDD 113 and reproducing information recorded on the HDD, and an FIFO (FIRST IN, FIRST OUT) memory 111 connected to the DMA controller 112 and the inside bus 5. Further, the HDD block 110 corresponds to the second recording means of the intermittent data recording device and the second intermittent data recording control device of the invention. Further, the hard disk in the HDD 113 corresponds to the second recording medium of the second intermittent data recording device, the second intermittent data recording control device, the second method of recording intermittent data and the second method of controlling recording of intermittent data of the invention.

In the embodiment, the RAM block (memory controller 31) 3 is, under the control of the CPU 7, made to record input information in the order as it is inputted while the information recorded on the RAM 32 is read out to be transferred to the HDD block 110 through the inside bus 5 when the input information recorded on the RAM 32 reaches the predetermined amount (first predetermined amount). Further, like the first embodiment, in the RAM block 3, the rate of reading-out data is made much faster than that of writing data to the RAM 32. As a result, transferring data from the RAM block 3 to the HDD block 110 can be started when input information recorded on the RAM 32 reaches the recording capacitance of the RAM 32. Accordingly, the predetermined amount (first predetermined amount) mentioned above may basically be the same as the recording capacitance of the RAM 32. However, in practice, it is preferable to have some space between the operation of recording and reproducing data in the RAM block 3. Accordingly, it is preferable to set the above-mentioned predetermined amount smaller than the recording capacitance of the RAM 32.

The RAM 32 is, at least on the appearance, made to perform the operation of recording and reproducing simultaneously. For example, the simultaneous recording and reproducing can be perfectly performed by using a dual-port RAM having two ports for inputting/outputting data in the RAM 32. Further, in a case where a regular RAM having only one port for inputting/outputting is used in the RAM 32, the operation of recording and reproducing can be simultaneously performed at least on the appearance by, for example, performing the operation of recording and reproducing by time-division using a time slot.

Further, in the embodiment, the HDD block 110 (DAM controller 112) is, under the control of the CPU 7, made to temporarily record intermittent data included in the input information recorded on the RAM 32 on the hard disk in the HDD 113 while the information recorded on the hard disk is read out to be transferred to the VTR block 4 through the inside bus 5 when the intermittent data recorded on the hard disk reaches the predetermined amount (second predetermined amount). Further, in the embodiment, the operation of recording and reproducing in the HDD block is performed by time-division. Accordingly, the above-mentioned predetermined amount (second predetermined amount) is a data amount which enables to transfer intermittent data recorded on the hard disk to the VTR block 4 and record the transferred data on the video tape 44 between the operation of recording intermittent data transferred from the RAM block 3. For example, the predetermined amount can be represented as the predetermined amount A in a formula (1) in the following provided that time in which recording operation is not performed in the HDD block 110 is T (see FIG. 9), and the rate of transferring data from the HDD block 110 to the VTR block 4 is Vd. Further, the predetermined amount does not become larger than the recording capacitance of the hard disk in the HDD 113 naturally.

$$A \leq T \times Vd \qquad (1)$$

In the embodiment, the VTR block 4 is the portion for recording intermittent data transferred from the hard disk in the HDD 113 on the video tape 44 as a tape recording medium while reproducing intermittent data from the video tape 44.

In the embodiment, the CPU 7 as control means controls the RAM block 3, the VTR block 4 and the HDD block 110 to record input information on the RAM 32 as the first recording medium, to transfer intermittent data included in the first predetermined amount of input information recorded on the RAM 32 to be recorded on the HDD 113 while continuing recording of input information on the RAM 32 when input information recorded on the RAM 32 reaches the first predetermined amount, and to transfer the second predetermined amount of intermittent data recorded on the HDD 113 to be recorded on the video tape 44 when intermittent data recorded on the HDD 113 reaches the second predetermined amount.

Figure 7:
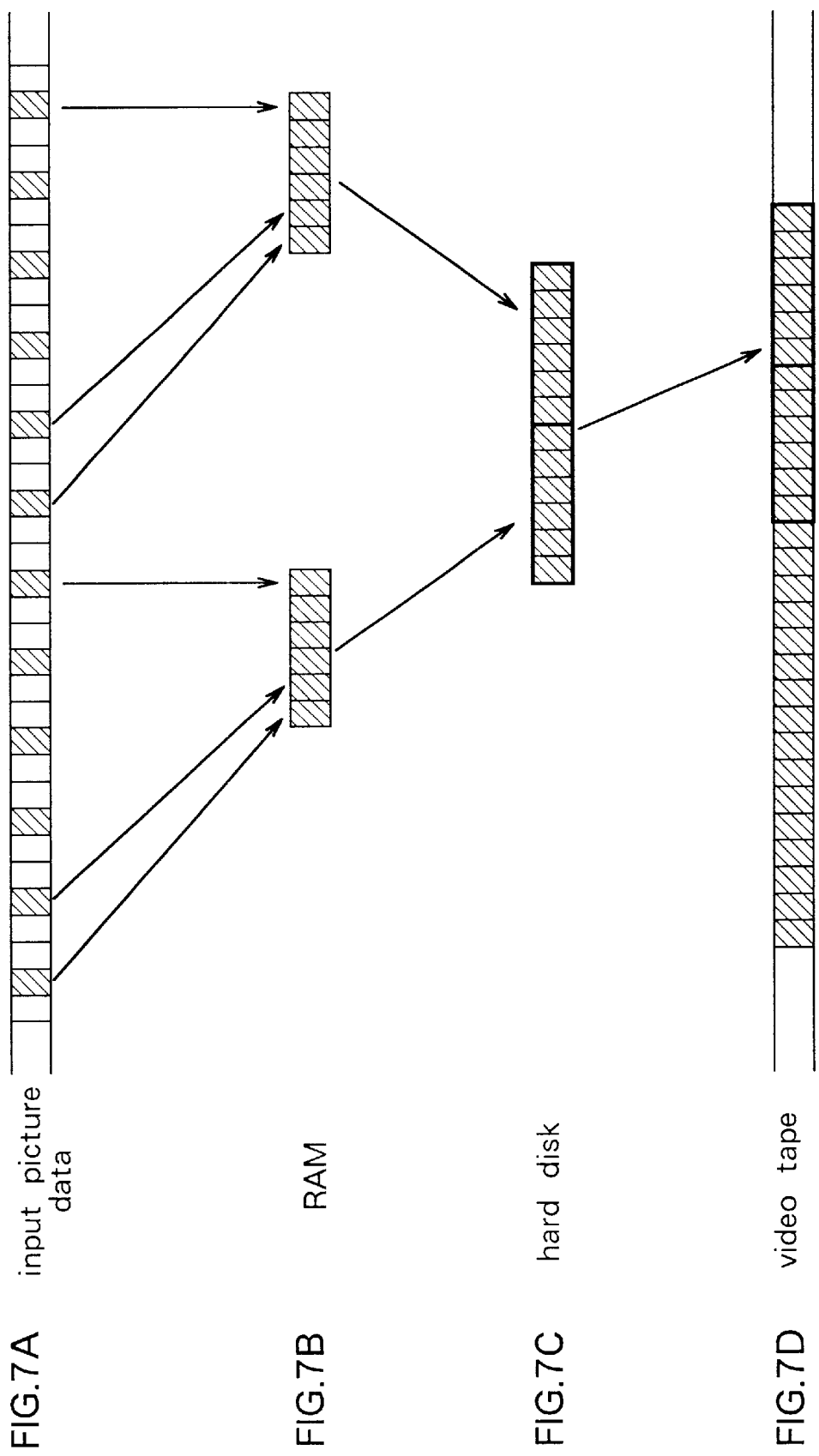
FIG. 7A, FIG. 7B, FIG. 7C and FIG. 7D are explanatory drawings showing the flow of data until input information is recorded on a video tape as intermittent data and the data structure in the intermittent data recording device according to the third embodiment of the invention.

Here, the flow of input picture data $D_{IN}$ inputted in the device, until it is recorded on the video tape 44 as intermittent data in the embodiment, will be described with reference to FIG. 7A to FIG. 7D along with its data structure. Further, FIG. 7A shows a data structure of a video frame of the input picture data $D_{IN}$ in real time while FIG. 7B shows a data structure in the RAM 32. Further, FIG. 7C shows a data structure in the hard disk in the HDD 113 while FIG. 7D shows a data structure in the video tape 44.

In the embodiment, the input picture data $D_{IN}$ as input information inputted in the device is continuous data (FIG. 7A) in terms of time like the first embodiment described above. For example, when it is made to be intermittent data while being recorded, the CPU 7 controls the RAM block 3 in order to intermittently record picture data inputted in the RAM block 3 to the RAM 32. In an example shown in FIG. 7A to FIG. 7D, one frame of data among three frames of input picture data $D_{IN}$ is intermittently recorded. Further, when it is made to be intermittent data before being recorded, the CPU 7 controls the bus control portion 6 to make picture data intermittent, which is to be inputted in the RAM block 3.

Further, data which has not been made intermittent may be made intermittent when transferring data from the RAM 32 to the HDD 113 after recording data on the RAM 32. In such a case, for example, the CPU 7 controls the HDD block 110 to reproduce picture data from the intermittent address when reproducing data from the RAM 32.

Further, when picture data, which is made to be intermittent data, is recorded on the RAM 32 to the predetermined amount (first predetermined amount, six frames of data in FIG. 7A to FIG. 7D), the predetermined amount of the intermittent data recorded on the RAM 32 is transferred to the HDD block 110 and recorded on the hard disk in the HDD 113 (FIG. 7C). Further, recording picture data on the RAM 32 is continued while transferring intermittent data. Accordingly, in the embodiment, the RAM block 3 operates continuously so that picture data being made to be intermittent data is continuously recorded on the RAM 32 in terms of time.

Further, when picture data, which is made to be intermittent data, is recorded on the hard disk in the HDD 113 to the predetermined amount (second predetermined amount, twelve frames of data in FIG. 7A to FIG. 7D), the predetermined amount of intermittent data recorded on the hard disk in the HDD 113 is transferred to the VTR block 40 and recorded on the video tape 44 (FIG. 7D). Further, recording and reproducing of intermittent data in the HDD 113 are performed by time-division.

Next, operation of the intermittent data recording device according to the embodiment will be described. Further, the description in the following includes the method of recording intermittent data and the method of controlling recording of intermittent data of the invention.

First, the main operation of the intermittent data recording device of the embodiment will be described according to the flow chart shown in FIG. 8 by referring to the block diagram shown in FIG. 6.

In the intermittent data recording device according to the embodiment, the CPU 7 controls the RAM block 3 through the bus control portion 6 to start recording input information from outside the device (step S201) when starting the operation is indicated and the input picture data $D_{IN}$ from outside the device is inputted as input information. In the recording operation in the RAM block 3, the input picture data $D_{IN}$ is A/D converted by the A/D converter 1, compressed by the compression processing portion 2, transferred to the RAM block 3 through the inside bus 5 and recorded on the RAM 32 by the RAM block 3. Further, data recorded on the RAM 32 at this time may be continuous data which is not made to be intermittent data (intermittent data which is to be recorded on the video tape 44 in the end), or data which is made to be intermittent data before or during recording data on the RAM 32 as shown in FIG. 7A and FIG. 7B.

Next, the CPU 7 judges whether data recorded on the RAM 32 has reached the predetermined amount (first predetermined amount) or not (step S202). At this time, the judging operation is repeated when the recorded data has not reached the predetermined amount (step S202: N).

On the other hand, when the recorded data reaches the predetermined amount (step S202: Y), the CPU 7 controls the RAM block 3 to start the reproducing operation of the predetermined amount of data recorded in the RAM block 3 (step S203) while making the data-recording on the RAM 32 continued, and start the transferring operation of the reproduced data to the HDD block 110 (step S204). At this time, transferring data from the RAM block 3 to the HDD block 110 is performed through the inside bus 5. Further, in a case where data recorded on the RAM 32 in the step S201 is continuous data which is not made to be intermittent data, the CPU 7 controls the RAM block 3 to make data reproduced from the RAM 32 be intermittent data. Further, in a case where data recorded on the RAM 32 in the step S201 is data which has been already made to be intermittent, the process of making data intermittent is not required to be performed.

When transferring data from the RAM block 3 to the HDD block 110 starts in the step S204, the CPU 7 controls the HDD block 110 through the bus control portion 6 to start the recording operation of intermittent data transferred from the RAM block 3 on the HDD 113 (step S205). In the recording operation in the HDD block 110 at this time, the intermittent data from the RAM block 3 is transferred to the HDD block 110 through the inside bus 5, given to the DMA controller 112 through the FIFO memory 111, and recorded on the hard disk in the HDD 113 by the DMA controller 112.

Next, the CPU 7 judges whether reproduction of the predetermined amount of data recorded in the RAM block 3 is completed or not (step S206). When it is not completed (N), the judging operation is repeated. When it is completed (step S206: Y), the CPU 7 controls the RAM block 3 to stop the reproducing operation of data recorded on the RAM 32 (step S207) while finishing transferring intermittent data to the HDD block 110 (step S208). Further, the CPU 7 controls the HDD block 110 to stop the recording operation of intermittent data transferred from the RAM block 3 on the hard disk in the HDD 113 (step S209).

Next, the CPU 7 judges whether intermittent data recorded on the hard disk in the HDD 113 has reached the predetermined amount (second predetermined amount) or not (step S210). At this time, when the recorded intermittent data has not reached the predetermined amount (step S210: N), the process returns to the step S201.

On the other hand, when the recorded data has reached the predetermined amount (step S210: Y), the CPU 7 controls the HDD block 110 to start the reproducing operation of the predetermined amount of data recorded on the HDD block 110 (step S211) while starting the transferring operation of the reproduced data to the VTR block 4 (step S212). At this time, transferring data from the HDD block 110 to the VTR block 4 is performed through the inside bus 5.

When transferring data from the HDD block 110 to the VTR block 4 is started in the step S212, the CPU 7 controls the VTR block 4 to start the recording operation of intermittent data transferred from the HDD block 110 on the video tape 44 (step S213).

Further, in the embodiment, the operation of recording and reproducing intermittent data in the HDD block 110 is performed by time-division. Accordingly, the predetermined amount (second predetermined amount) in the step 210 is the amount which enables to transfer intermittent data recorded on the hard disk and records it on the video tape 44 in the VTR block 4, between the operation of recording intermittent data transferred from the RAM block 3 on the hard disk in the HDD 113.

Next, the CPU 7 judges whether reproduction of the predetermined amount of data recorded on the HDD block 110 is completed or not (step S214). When it is not completed (N), the judging operation is repeated. When it is completed (step S214: Y), the CPU 7 controls the HDD block 110 to stop the reproducing operation of intermittent data recorded on the hard disk in the HDD 113 (step S215) while finishing transferring intermittent data to the VTR block 4 (step S216). Finally, the CPU 7 controls the VTR block 4 to stop the recording operation of intermittent data transferred from the HDD block 110 on the video tape 44 (step S217) and the process returns to the step S201.

Figure 8:
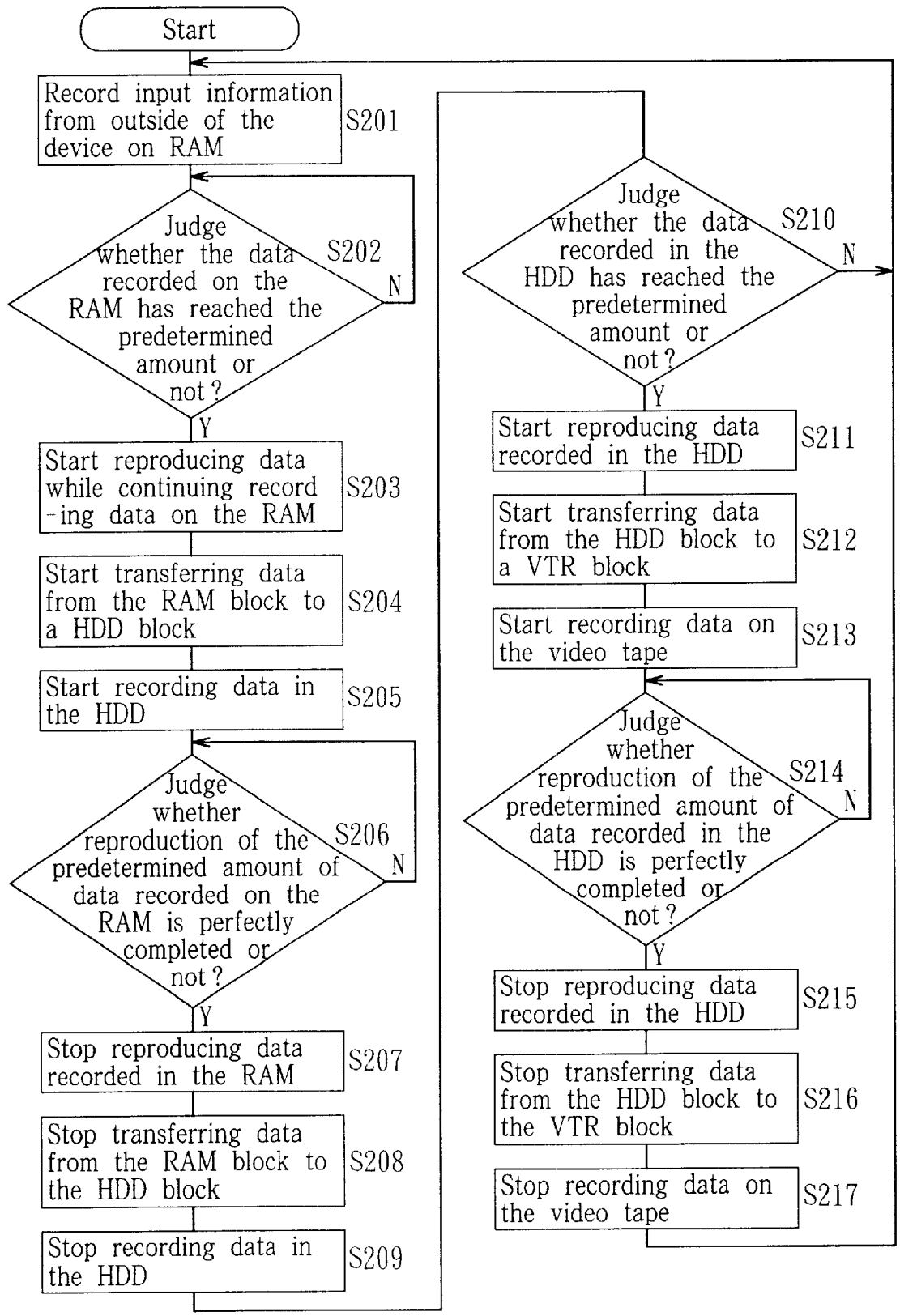
FIG. 8 is a flow chart showing a main operation of the intermittent data recording device according to the third embodiment of the invention.
Figures 9A, 9B, 9C:
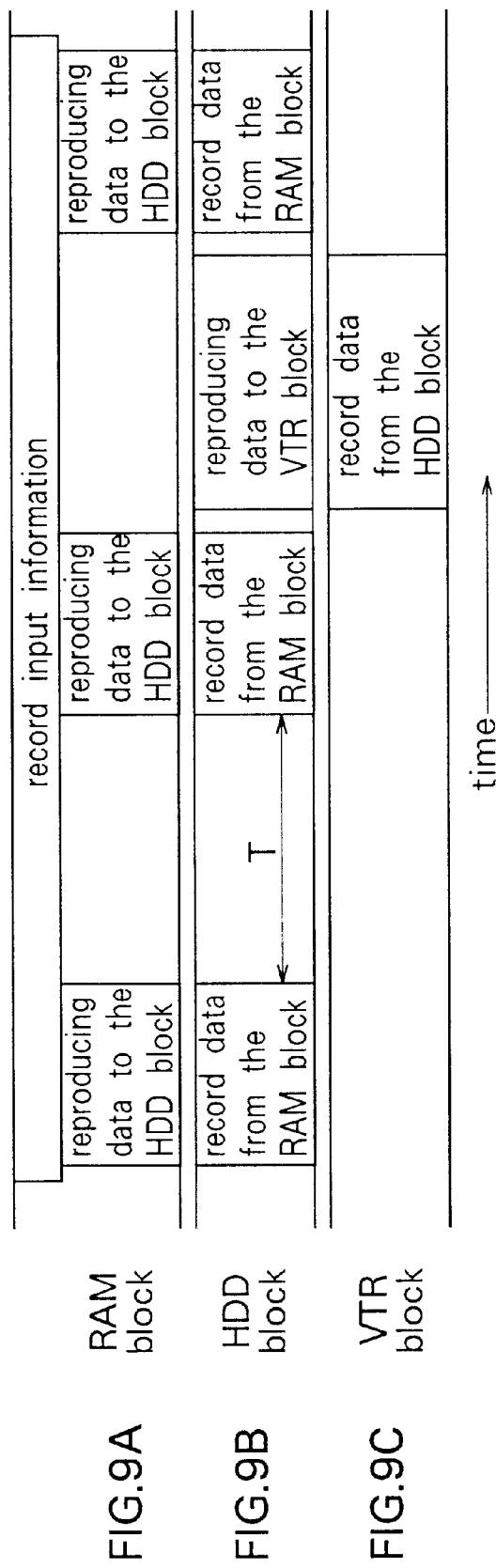
FIG. 9A, FIG. 9B and FIG. 9C are explanatory drawings showing timing of the operation of the intermittent data recording device according to the third embodiment of the invention.

FIG. 9A to FIG. 9C show the operation timing of the RAM block 3, the VTR block 4 and the HDD block 110 when the recording operation of intermittent data is performed according to the operation shown in FIG. 8. In such a case, in the RAM block 3, as shown in FIG. 9A, when the recorded data reaches the predetermined amount (first predetermined amount) while continuously performing the recording operation of input information, the reproducing operation of the recorded information on the HDD block 110 is started without interrupting the recording operation of input information. Further, the reproducing operation finishes when reproduction of the predetermined amount of data which has been recorded is completed.

On the other hand, as shown in FIG. 9B, the recording operation of intermittent data is started at the same time as the reproducing operation in the RAM block 3 is started, and the recording operation finishes when the reproducing operation in the RAM block 3 finishes. Further, in such a case, in the HDD block 110, the reproducing operation of intermittent data recorded on itself to the VTR block 4 is started when the recorded intermittent data reaches the predetermined amount (second predetermined amount), between the operation of recording intermittent data transferred from the RAM block 3. Further, the reproducing operation finishes when the predetermined amount of data being recorded is completely reproduced.

Further, in the VTR block 4, as shown in FIG. 9C, the recording operation of intermittent data is started at the same time as the reproducing operation in the HDD block 110 is started, and the recording operation finishes when the reproducing operation in the HDD block 110 finishes.

According to the embodiment as described above, the hard disk in the HDD 113, in addition to using the RAM 32, is used as a recording medium for temporarily recording intermittent data which is to be recorded on the video tape 44. Further, the CPU 7 controls the RAM block 3, the VTR block 4 and the HDD block 110 to record input information on the RAM 32, transfer intermittent data included in the first predetermined amount of input information recorded on the RAM 32 to be recorded on the HDD 113 while continuing recording of input information on the RAM 32 when input information reaches the first predetermined amount, and transfer the second predetermined amount of intermittent data recorded on the HDD 113 to be recorded on the video tape 44 when intermittent data recorded on the HDD 113 reaches the second predetermined amount. As a result, a vast amount of information can be temporarily recorded. Accordingly, the number of recording information on the video tape 44 is decreased and the device with less burden on the VTR block 4 can be achieved.

Further, according to the embodiment, recording a vast amount of information can be achieved with a low cost since the RAM 32 and the HDD 113 are used together. For example, when trying to record a vast amount of information like the embodiment in a case of using the same structure (structure which does not comprise HDD block 110) as that of the first embodiment, the RAM 32 with a large capacitance, which is costly, is required and cost is largely increased. Further, in the configuration shown in FIG. 6, using only the HDD by making the configuration of the RAM block 3 same as the HDD block 110 can be considered. However, in such a case, simultaneous recording and reproducing is required to be performed to the HDD which is used instead of the RAM block 3 so that the HDD with high performance is required because of the limitation in the data transferring rate of recording and reproducing. For example, provided that the data transferring rate in the VTR block 4 is 25 Mbps, the HDD with high performance having the data transferring rate of about 50 Mbps is required so that cost is largely increased. In contrast, the embodiment, as described above, can implement it with lower cost since the RAM 32 and the HDD 113 are used together.

Further, other configurations, operations and effects are identical to those of the first embodiment.

FOURTH EMBODIMENT

Next, a fourth embodiment of the invention will be described. In the third embodiment described above, the input picture data $D_{IN}$ with a continuous data structure in terms of time is inputted in the device as input information and the inputted input picture data $D_{IN}$ is made to be intermittent data in the device to be recorded. However, in the embodiment, the input picture data $D_{IN}$ which is to be inputted to the device is intermittent data in terms of time.

Figure 10:
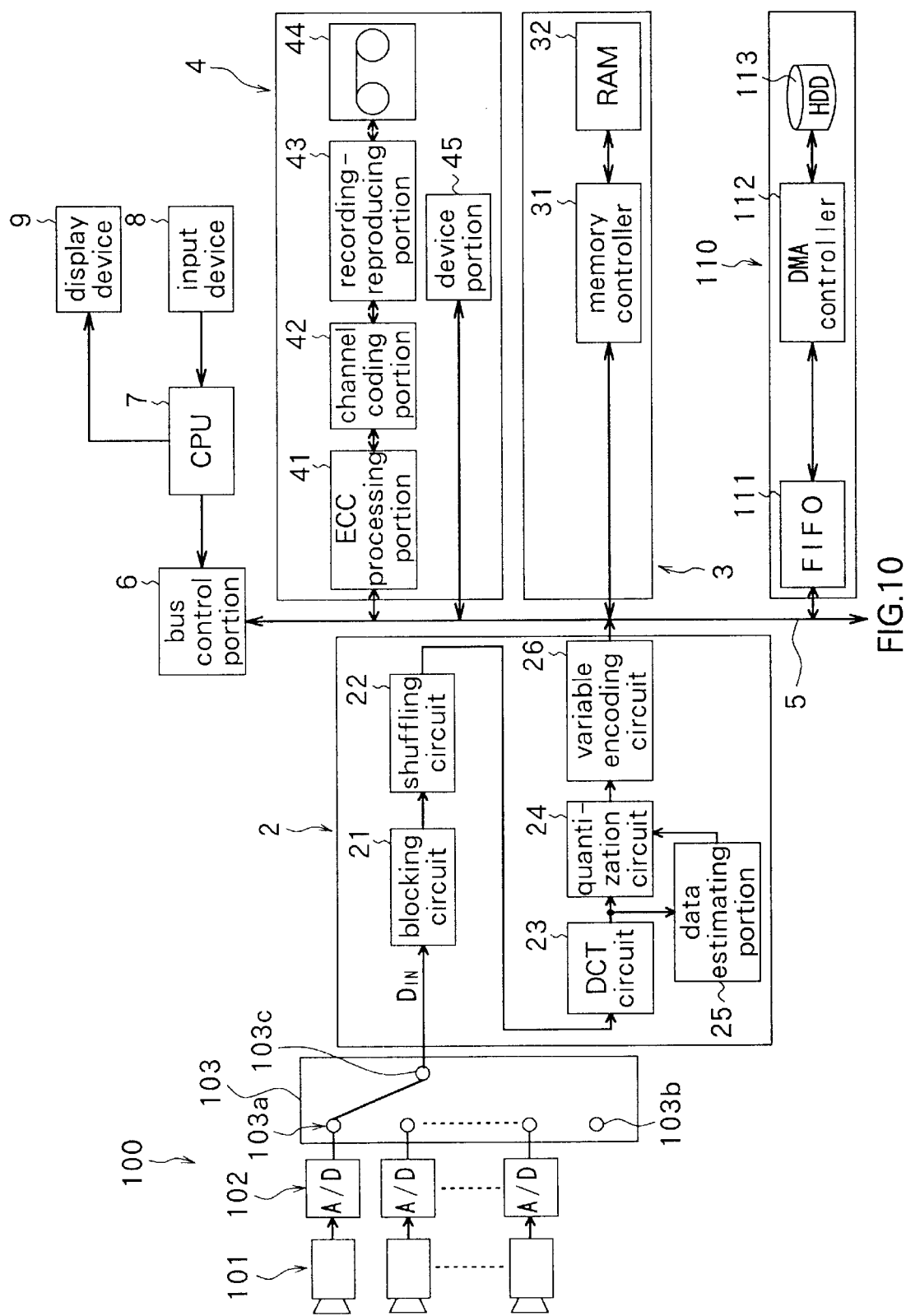
FIG. 10 is a block diagram showing a configuration of an intermittent data recording device according to a fourth embodiment of the invention.

FIG. 10 is a block diagram showing the configuration of the intermittent data recording device according to the embodiment. Further, like numerals are adopted to the configurations identical to those of the intermittent data recording device according to the second and third embodiments and the description will be omitted.

In the intermittent data recording device according to the embodiment, the intermittent input picture data $D_{IN}$ as input information from the outside input device 100 is made to be inputted in the blocking circuit 21 of the compression processing portion 2. The outside input device 100 has the configuration identical to that of the outside input device 100 used in the intermittent data recording device (FIG. 5) according to the second embodiment.

In the intermittent data recording device according to the embodiment, the intermittent input picture data $D_{IN}$ inputted from the above-mentioned outside input device is, like the intermittent data recording device according to the third embodiment, transferred to the RAM block 3 through the inside bus 5 and recorded on the RAM 32 after being compressed in the compression processing portion 2. Further, the operation after recording data on the RAM block 3 is identical to that of the third embodiment.

Further, other configurations, operations and effects are identical to those of the third embodiment.

Further, the invention is not limited to the above-mentioned embodiments but various modification can be applicable. For example, the invention is not limited to a case where the video signals are compressed to be recorded but can be applied to a case where they are recorded without being compressed. Further, the invention can be applied to devices for other use such as a recording device used for various kinds of observation and so on, in addition to the video recording device for surveillance.

As described above, in the first intermittent data recording device, the first intermittent data recording control device, the first intermittent data recording method and the first intermittent data recording control method of the invention, input information is recorded on a predetermined recording medium, and intermittent data included in the predetermined amount of input information recorded on the predetermined recording medium is transferred to the tape recording medium to be recorded while continuing recording of input information when input information recorded on the predetermined recording medium reaches the predetermined amount. As a result, the number of the recording operation performed to the tape recording medium can be suppressed to minimum. Accordingly burden on the device portion and the tape recording medium occurred through recording of intermittent data can be suppressed.

Further, in the second intermittent data recording device, the second intermittent data recording control device, the second intermittent data recording method and the second intermittent data recording control method of the invention, input information is recorded on the first recording medium, and intermittent data included in the first predetermined amount of input information recorded on the first recording medium is transferred to the second recording medium to be recorded while continuing recording of input information when input information recorded on the first recording medium reaches the first predetermined amount. Further, the second predetermined amount of intermittent data recorded on the second recording medium is transferred to be recorded on the tape recording medium when intermittent data recorded on the second recording medium reaches the second predetermined amount. As a result, the number of the recording operation performed on the tape recording medium can be suppressed to minimum. Accordingly burden to the device portion and the tape recording medium occurred through recording of intermittent data can be suppressed while enabling temporary recording of a vast amount of information.

With the description above, it is obvious that various modifications of the invention can be applicable. Accordingly, within a scope of claims in the followings, the invention can be implemented in other embodiments in addition to the embodiments described above in detail.

What is claimed is:

1. An intermittent data recording device for recording intermittent data on a tape recording medium comprising:
   first recording means for recording input information including intermittent data which is to be recorded on the tape recording medium on only a single predetermined recording medium;
   second recording means for recording the intermittent data included in the input information on a tape recording medium; and
   control means for controlling the first recording means and the second recording means to transfer the intermittent data included in a predetermined amount of the input information recorded on the single predetermined recording medium from the single predetermined recording medium to the tape recording medium to be recorded thereat while continuing recording of the input information onto the single predetermined recording medium when the input information recorded on the single predetermined recording medium reaches the predetermined amount.

2. An intermittent data recording device according to claim 1 wherein the input information is inputted to the device intermittently.

3. An intermittent data recording device according to claim 1 wherein the input information is continuously inputted to the device while being made to be intermittent data in the device.

4. An intermittent data recording device according to claim 1 wherein the input information is continuously inputted to the device while being made to be intermittent data when being transferred to the tape recording medium.

5. An intermittent data recording device according to claim 1 further comprising compressing means for compressing the input information and giving it to the first recording means.

6. An intermittent data recording device for recording intermittent data on a tape recording medium comprising:
   first recording means for recording input information including intermittent data which is to be recorded on the tape recording medium on a first recording medium;
   second recording means for recording the intermittent data included in the input information recorded on the first recording medium on a second recording medium;
   third recording means for recording the intermittent data recorded on the second recording medium on the tape recording medium; and
   control means for controlling the first recording means, the second recording means and the third recording means to transfer the intermittent data included in a first predetermined amount of input information recorded on the first recording medium from the first recording medium to the second recording medium to be recorded thereat while continuing recording of the input information onto the first recording medium when the input information recorded on the first recording medium reaches the first predetermined amount, and to transfer the second predetermined amount of the intermittent data recorded on the second recording medium from the second recording medium to the tape recording medium to be recorded thereat when the intermittent data recorded on the second recording medium reaches the second predetermined amount.

7. An intermittent data recording device according to claim 6 wherein the input information is inputted to the device intermittently.

8. An intermittent data recording device according to claim 6 wherein the input information is continuously inputted to the device while being made to be intermittent data in the device.

9. An intermittent data recording device according to claim 6 wherein the input information is continuously inputted to the device, while being made to be intermittent data when being transferred to the second recording medium.

10. An intermittent data recording device according to claim 6 further comprising compressing means for compressing the input information and giving it to the first recording means.

11. An intermittent data recording control device for controlling recording of intermittent data on a tape recording medium by a tape recording device comprising:

input information recording means for recording input information including intermittent data which is to be recorded on the tape recording medium on a single predetermined recording medium; and control means for controlling the input information recording means and the tape recording device to record the input information on the single predetermined recording medium, and to transfer the intermittent data included in the predetermined amount of input information recorded on the single predetermined recording medium to be recorded on the tape recording medium while continuing recording of the input information on to the single predetermined recording medium when the input information recorded on the single predetermined recording medium reaches a predetermined amount.

12. An intermittent data recording control device for controlling recording of intermittent data on a tape recording medium by a tape recording device comprising:

first recording means for recording input information including intermittent data, which is to be recorded on the tape recording medium, on only a first recording medium;

second recording means for recording the intermittent data included in the input information recorded on the first recording medium on a second recording medium; and control means for controlling the first recording means, the second recording means and the tape recording device to transfer the intermittent data included in a first predetermined amount of input information recorded on the first recording medium from the first recording medium to the second recording medium to be recorded thereat while continuing recording of the input information onto the first recording medium when the input information recorded on the first recording medium reaches the first predetermined amount, and to transfer the second predetermined amount of the intermittent data recorded on the second recording medium from the second recording medium to the tape recording medium to be recorded thereat when the intermittent data recorded on the second recording medium reaches the second predetermined amount.

13. A method of recording intermittent data for recording intermittent data on a tape recording medium wherein:

input information including intermittent data which is to be recorded on the predetermined tape recording medium is recorded on only a single predetermined recording medium; and the intermittent data included in a predetermined amount of the input information recorded on the single predetermined recording medium is transferred from the predetermined recording medium to the tape recording medium to be recorded thereat while recording of the input information onto the single predetermined recording medium is continued when the input information recorded on the predetermined recording medium reaches a predetermined amount.

14. A method of recording intermittent data for recording intermittent data on a tape recording medium wherein:

input information including intermittent data, which is to be recorded on the predetermined tape recording medium, is recorded on only a first recording medium;

the-intermittent data included in a first predetermined amount of the input information recorded on the first recording medium is transferred from the first recording medium to a second recording medium to be recorded thereat while recording of the input information onto the first recording medium is continued when the input information recorded on the first recording medium reaches the first predetermined amount; and the intermittent data included in a second predetermined amount of the input information recorded on the second recording medium is transferred from the second recording medium to a tape recording medium to be recorded thereat, when the input information recorded on the second recording medium reaches the second predetermined amount.

15. A method of controlling recording of intermittent data on a tape recording medium by a tape recording device wherein:

input information including intermittent data, which is to be recorded on the predetermined tape recording medium, is recorded on only a single predetermined recording medium; and the intermittent data included in a first predetermined amount of the input information recorded on the single predetermined recording medium is transferred from the predetermined recording medium to the tape recording medium to be recorded thereat while recording of the input information onto the single predetermined recording medium is continued when the input information recorded on the predetermined recording medium reaches a predetermined amount.

16. A method of controlling recording of intermittent data for recording intermittent data on a tape recording medium by a tape recording device wherein;

input information including intermittent data, which is to be recorded on the predetermined tape recording medium, is recorded on only a first recording medium;

the intermittent data included in a first predetermined amount of the input information recorded on the first recording medium is transferred from the first recording medium to a second recording medium to be recorded thereat while recording of the input information onto the first recording medium is continued when the input information recorded on the first recording medium reaches the first predetermined amount; and the intermittent data included in a second predetermined amount of the input information recorded on the second recording medium is transferred from the second recording medium to the tape recording medium to be recorded thereat, when the input information recorded on the second recording medium reaches the second predetermined amount.

* * * * *